(12) United States Patent
Fukushima

(10) Patent No.: US 12,075,556 B2
(45) Date of Patent: Aug. 27, 2024

(54) CIRCUIT BOARD, SEMICONDUCTOR DEVICE, POWER CONVERTER, AND MOVING OBJECT

(71) Applicant: Mitsubishi Electric Corporation, Tokyo (JP)

(72) Inventor: Yuta Fukushima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 395 days.

(21) Appl. No.: 17/290,461

(22) PCT Filed: Feb. 25, 2019

(86) PCT No.: PCT/JP2019/007068
§ 371 (c)(1),
(2) Date: Apr. 30, 2021

(87) PCT Pub. No.: WO2020/174535
PCT Pub. Date: Sep. 3, 2020

(65) Prior Publication Data
US 2021/0378085 A1    Dec. 2, 2021

(51) Int. Cl.
H05K 1/00    (2006.01)
H05K 1/02    (2006.01)

(52) U.S. Cl.
CPC ......... H05K 1/0201 (2013.01); H05K 1/0269 (2013.01)

(58) Field of Classification Search
CPC ....... H02G 3/086; H02G 5/06; H05K 7/20854
See application file for complete search history.

(56) References Cited

U.S. PATENT DOCUMENTS

| | | | | |
|---|---|---|---|---|
| 4,891,250 A | * | 1/1990 | Weibe | G01K 11/16 428/209 |
| 2015/0173178 A1 | * | 6/2015 | Morzos | H05K 3/3452 361/783 |
| 2020/0266240 A1 | | 8/2020 | Morisaki et al. | |

FOREIGN PATENT DOCUMENTS

| | | |
|---|---|---|
| EP | 0241247 A2 | 10/1987 |
| JP | S59-031268 U | 2/1984 |
| JP | S59-126643 A | 7/1984 |
| JP | H01-112123 A | 4/1989 |
| JP | H09-283307 A | 10/1997 |
| JP | 2000-223830 A | 8/2000 |
| JP | 2001-023850 A | 1/2001 |
| JP | 2002-117689 A | 4/2002 |

(Continued)

OTHER PUBLICATIONS

JP 59126643 A-1984; English Translation (Year: 1984).*

(Continued)

*Primary Examiner* — Pete T Lee
(74) *Attorney, Agent, or Firm* — Studebaker & Brackett PC

(57) ABSTRACT

The first and second electronic components are mounted on a printed circuit board. A temperature indicating resin comes in contact with not the second electronic component but the first electronic component. The temperature indicating resin visually changes upon increase in the temperature. Alternatively, an electronic component is mounted on the printed circuit board. The temperature indicating resin comes in contact with not the electronic component but the printed circuit board. The temperature indicating resin visually changes upon increase in the temperature.

7 Claims, 6 Drawing Sheets

(56) References Cited

FOREIGN PATENT DOCUMENTS

| | | |
|---|---|---|
| JP | 2005-259923 A | 9/2005 |
| JP | 2007-073604 A | 3/2007 |
| WO | 2018/193929 A1 | 10/2018 |

OTHER PUBLICATIONS

WO 2018193929 A1 English Translation (Year: 2018).*
International Search Report issued in PCT/JP2019/007068; mailed May 14, 2019.
An Office Action; "Notice of Reasons for Refusal", mailed by the Japanese Patent Office on Oct. 19, 2021, which corresponds to Japanese Patent Application No. 2021-501393 and is related to U.S. Appl. No. 17/290,461; with English language translation.
An Office Action; "Decision of Refusal," mailed by the Japanese Patent Office on Apr. 5, 2022, which corresponds to Japanese Patent Application No. 2021-501393 and is related to U.S. Appl. No. 17/290,461 with English language translation.
Trial and Appeal Decision mailed by the Japanese Patent Office on Nov. 21, 2023, which corresponds to Japanese Patent Application No. 2021-501393 and is related to U.S. Appl. No. 17/290,461; with English language translation.
An Office Action; "Notice of Reasons for Refusal," mailed by the Japanese Patent Office on Aug. 8, 2023, which corresponds to Japanese Patent Application No. 2021-501393 and is related to U.S. Appl. No. 17/290,461; with English language translation.
An Office Action issued by the State Intellectual Property Office of the People's Republic of China on Jun. 29, 2024, which corresponds to Chinese Patent Application No. CN 201980092667.X.

* cited by examiner

CIRCUIT BOARD, SEMICONDUCTOR DEVICE, POWER CONVERTER, AND MOVING OBJECT

TECHNICAL FIELD

The present invention relates to a circuit board. Furthermore, the present invention relates to a semiconductor device, a power converter, and a moving object each including the circuit board.

BACKGROUND ART

A circuit board often includes a printed circuit board and a plurality of electronic components. The plurality of electronic components are mounted on the printed circuit board.

Applying, to an object, a material which visually changes upon increase in the temperature for visually checking the temperature of the object has been proposed.

For example, according to the technology described in Patent Document 1, a composition is placed proximately to a surface for indicating whether a temperature of the surface exceeds a threshold temperature (lines 12 to 14 of a lower right column in page 194). If the temperature of the surface is above the threshold temperature, the composition is transparent; if the temperature of the surface is below the threshold temperature, the composition is opaque (lines 14 to 16 of the lower right column in page 194). The composition includes a transparent, flexible matrix material, and an indicating material dispersed within the matrix material (lines 1 to 3 of an upper right column in page 195). The indicating material is particulate (lines 7 to 8 of an upper left column in page 196). The indicating material can be wax (lines 5 to 6 of an upper right column in page 196).

Furthermore, coating a circuit board for improving, for example, insulation and moisture resistance of the circuit board has been proposed.

For example, according to the technology described in Patent Document 2, a portion that lacks insulation and moisture resistance is coated with a thermoplastic resin in an electronic circuit including a board (line 18 of an upper right column to line 7 of a lower left column in page 186).

PRIOR ART DOCUMENT

Patent Document

[Patent Document 1] Japanese Patent Application Laid-Open No. H1-112123
[Patent Document 2] Japanese Patent Application Laid-Open No. S59-126643

SUMMARY

Problem to be Solved by the Invention

Visually checking whether a specific electronic component included in the plurality of electronic components mounted on the printed circuit board generates heat is sometimes required. For example, visually checking whether an electronic component that does not generate heat in a normal operation generates heat is sometimes required for determining whether the electronic component that does not generate heat in a normal operation is a normal component or an abnormal component. To do that, bringing a material which visually changes upon increase in the temperature in contact with the specific electronic component can check whether the specific electronic component generates heat. However, whether the specific electronic component generates heat cannot sometimes appropriately be checked, because the heat generated by an electronic component other than the specific electronic component is conducted to the material. For example, whether the electronic component that does not generate heat in a normal operation generates heat cannot sometimes appropriately be checked, because the heat generated by an electronic component that generates heat in a normal operation is conducted to the material.

The problems become apparent when the circuit board is a control board that controls a power semiconductor element. The reason why the problems become apparent when the circuit board is the control board that controls a power semiconductor element is as follows: the control board that controls a power semiconductor element is often a product from the small volume production of many models. Thus, when the circuit board is the control board that controls a power semiconductor element, positions at which electronic components are mounted often differ depending on the model of the circuit board. Consequently, the time required for determining the presence or absence of a faulty component in the circuit board tends to be prolonged.

Furthermore, visually checking whether a circuit board is exposed to heat is sometimes required. For example, visually checking whether the circuit board is exposed to heat is sometimes required for determining whether a thermal stress test has been conducted on the circuit board. To do that, bringing the material which visually changes upon increase in the temperature in contact with the circuit board can visually check whether the circuit board is exposed to heat. However, whether the circuit board is exposed to heat cannot sometimes appropriately be checked, because the heat generated by any of the plurality of electronic components is conducted to the material. For example, whether the circuit board is exposed to heat cannot sometimes appropriately be checked, because the heat generated by the electronic component that generates heat in a normal operation is conducted to the material.

The present invention has been conceived in view of these problems. The problem to be solved by the present invention is to provide a circuit board allowing to visually check with ease whether the first electronic component generates heat, irrespective of whether the second electronic component generates heat. Furthermore, another problem to be solved by the present invention is to provide a circuit board allowing to visually check with ease whether the circuit board is exposed to heat, irrespective of whether an electronic component generates heat.

Means to Solve the Problem

The present invention is directed to a circuit board.

According to the first aspect of the present invention, a circuit board includes a printed circuit board, a first electronic component, a second electronic component, and a temperature indicating resin. The first and second electronic components are mounted on the printed circuit board. The temperature indicating resin comes in contact with not the second electronic component but the first electronic component. The temperature indicating resin visually changes upon increase in a temperature.

According to the second aspect of the present invention, a circuit board includes a printed circuit board, an electronic component, and a temperature indicating resin. The electronic component is mounted on the printed circuit board.

The temperature indicating resin comes in contact with not the electronic component but the printed circuit board. The temperature indicating resin visually changes upon increase in a temperature.

The present invention is also directed to a semiconductor device, a power converter, and a moving object.

Effects of the Invention

According to the first aspect of the present invention, the temperature indicating resin does not visually change when the second electronic component generates heat. However, the temperature indicating resin visually changes when the first electronic component generates heat. Thus, it is possible to visually check whether the first electronic component generates heat, irrespective of whether the second electronic component generates heat.

According to the second aspect of the present invention, the temperature indicating resin does not visually change when an electronic component generates heat. However, the temperature indicating resin visually changes when a circuit board is exposed to heat. Thus, it is possible to visually check whether the circuit board is exposed to heat, irrespective of whether the electronic component generates heat.

The object, features, aspects, and advantages of the present invention will become more apparent from the following detailed description and the accompanying drawings.

DESCRIPTION OF EMBODIMENTS

1 Embodiment 1

Figure 1:
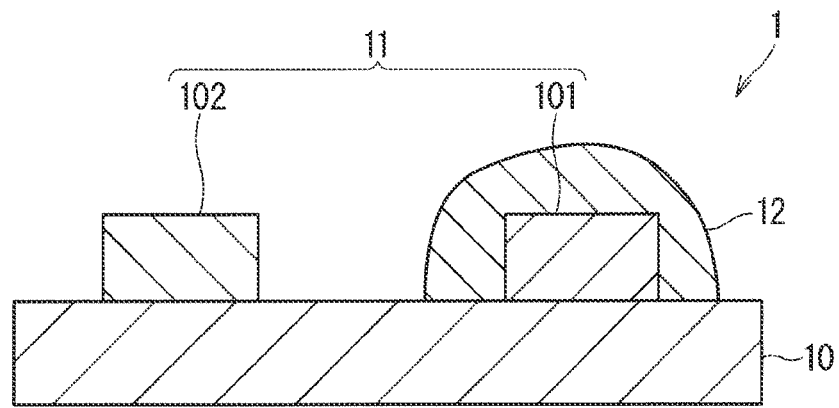
FIG. 1 is a cross-sectional view schematically illustrating a circuit board according to Embodiment 1.

FIG. 1 is a cross-sectional view schematically illustrating a circuit board according to Embodiment 1.

A circuit board 1 according to Embodiment 1 in FIG. 1 includes a printed circuit board 10 and a plurality of electronic components 11.

The plurality of electronic components 11 are mounted on the printed circuit board 10. The plurality of electronic components 11 to be mounted are electrically connected to a wiring pattern arranged on the printed circuit board 10.

Thus, the plurality of electronic components 11 and the wiring pattern arranged on the printed circuit board 10 form an electronic circuit.

Each of the electronic components 11 is an active component or a passive component. Examples of the plurality of electronic components 11 include a transistor, a diode, an integrated circuit (IC), a capacitor, a coil, a resistor, an inductor, and a transformer.

The plurality of electronic components 11 include a first electronic component 101 and a second electronic component 102. The first electronic component 101 and the second electronic component 102 have different exothermic properties.

The circuit board 1 includes a temperature indicating resin 12.

The temperature indicating resin 12 visually changes upon increase in the temperature. The temperature indicating resin 12 is applied not to the second electronic component 102 but to the first electronic component 101. Thus, the temperature indicating resin 12 comes in contact with not the second electronic component 102 but the first electronic component 101. When the second electronic component 102 generates heat, the temperature indicating resin 12 does not visually change. However, when the first electronic component 101 generates heat, the temperature indicating resin visually changes. Thus, it is possible to visually check whether the first electronic component 101 generates heat, irrespective of whether the second electronic component 102 generates heat.

The first electronic component 101 is preferably an electronic component that does not generate heat in a normal operation. The second electronic component 102 is preferably an electronic component that generates heat in a normal operation.

If the first electronic component 101 that does not generate heat in a normal operation is a normal component, the first electronic component 101 does not generate heat, and the temperature indicating resin 12 in contact with the first electronic component 101 does not visually change. If the first electronic component 101 that does not generate heat in a normal operation is an abnormal component, the first electronic component 101 sometimes generates heat, and the temperature indicating resin 12 in contact with the first electronic component 101 sometimes visually changes. Here, the state of the temperature indicating resin 12 is not influenced by the heat generated by the second electronic component 102 that generates heat in a normal operation. This enables visually checking whether the first electronic component 101 that does not generate heat in a normal operation is an abnormal component. Furthermore, checking whether the first electronic component 101 that does not generate heat in a normal operation is an abnormal component is not influenced by the heat generated by the second electronic component 1022 that generates heat in a normal operation.

When it is possible to visually check whether the first electronic component 101 that does not generate heat in a normal operation is an abnormal component, a faulty component can be found earlier during manufacturing of the circuit board 1. This can improve the quality of the circuit board 1, and reduce the loss cost of the circuit board 1. This can also shorten the time required to examine a cause of a faulty component in the circuit board 1, and simplify operations of examining the cause of the faulty component in the circuit board 1. These contribute to improvement of the productivity of the circuit board 1.

The advantages become apparent when the circuit board 1 is a control board that controls a power semiconductor element. The reason why the advantages become apparent when the circuit board 1 is the control board that controls a power semiconductor element is as follows: the control board that controls a power semiconductor element is often a product from the small volume production of many models. Thus, when the circuit board 1 is the control board that controls a power semiconductor element, positions at which electronic components are mounted often differ depending on the model of the circuit board 1. Consequently, the time required for determining the presence or absence of a faulty component in the circuit board 1 tends to be prolonged.

The first electronic component 101 is preferably a passive component. When the first electronic component 101 is a passive component, the temperature indicating resin 12 should be applied to only the passive component. This can shorten the time required to perform the operation of applying the temperature indicating resin 12, and reduce the amount of the temperature indicating resin 12 to be used. This also contributes to reduction of the cost of the circuit board 1.

Figure 2:
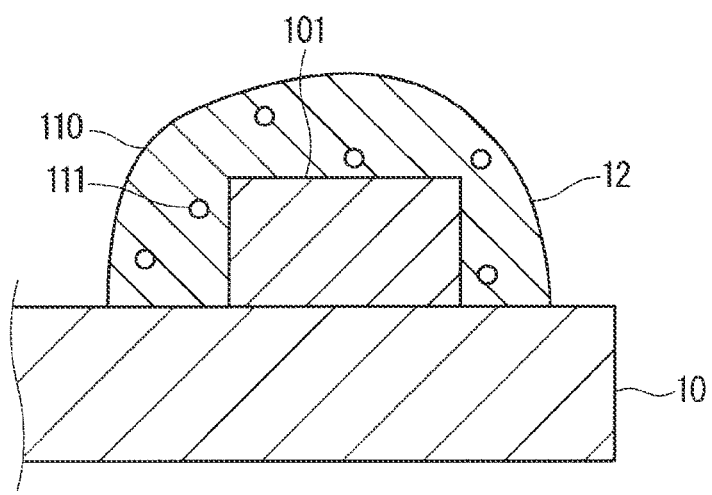
FIG. 2 is an enlarged cross-sectional view schematically illustrating a part of the circuit board according to Embodiment 1.
Figure 3:
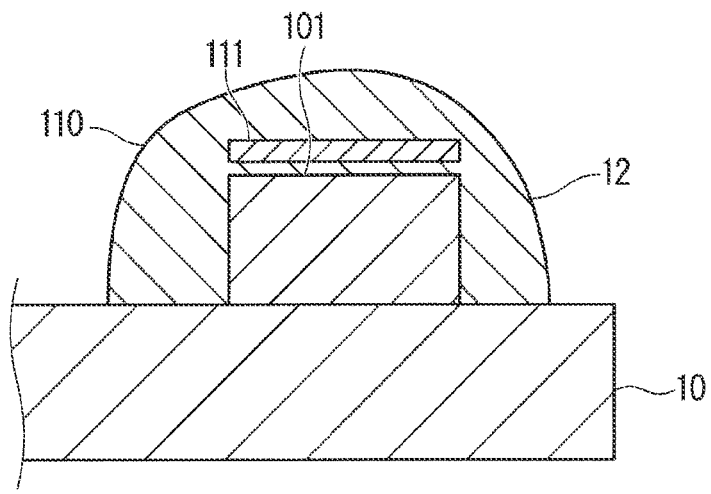
FIG. 3 is an enlarged cross-sectional view schematically illustrating a part of the circuit board according to Embodiment 1.
Figure 4:
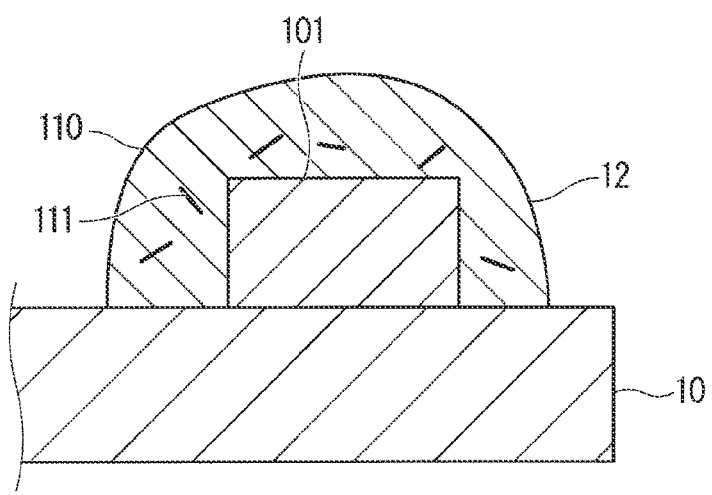
FIG. 4 is an enlarged cross-sectional view schematically illustrating a part of the circuit board according to Embodiment 1.

FIGS. 2 to 4 are enlarged cross-sectional views each schematically illustrating a part of the circuit board according to Embodiment 1. FIG. 2, FIG. 3, and FIG. 4 illustrate the first example, the second example, and the third example of the temperature indicating resin, respectively.

As illustrated in FIGS. 2 to 4, the temperature indicating resin 12 includes a resin 110 and a temperature indicating material 111. The temperature indicating material is also called, for example, an indicator material.

The temperature indicating material 111 is embedded in the resin 110. The temperature indicating material 111 reacts at a temperature higher than or equal to a specific temperature higher than room temperatures. For example, the temperature indicating material 111 melts at the temperature higher than or equal to the specific temperature. When the first electronic component 101 generates heat, the heat generated by the first electronic component 101 is conducted to the temperature indicating material 111. The temperature of the temperature indicating material 111 becomes higher than or equal to the specific temperature. Then, the temperature indicating material 111 melts. When the temperature of the temperature indicating material 111 returns to a temperature lower than the specific temperature and the temperature indicating material 111 hardens, the temperature indicating resin 12 visually changes.

The resin 110 is, for example, a polyolefine resin.

The temperature indicating material 111 is, for example, wax.

In the first example illustrated in FIG. 2, the temperature indicating material 111 is particulate wax. When the temperature indicating material 111 is particulate wax, the temperature indicating material 111 is incorporated into a resin to be hardened so that a mixture of the resin to be hardened and the temperature indicating material 111 is prepared. The prepared mixture is applied, and the applied mixture hardens.

In the second example illustrated in FIG. 3, the temperature indicating material 111 is plate-shaped wax. Since there is no need to perform an operation of incorporating the temperature indicating material 111 into the resin to be hardened in this case, the operation of applying the temperature indicating resin 12 can be simplified. This contributes to improvement of the productivity of the circuit board 1.

In the third example illustrated in FIG. 4, the temperature indicating material 111 is flake wax. When the temperature indicating material 111 is flake wax, the sensitivity of the temperature indicating resin 12 to changes in temperature will be improved.

2 Comparison Between Embodiment 1 and Reference Example

Figure 9A:
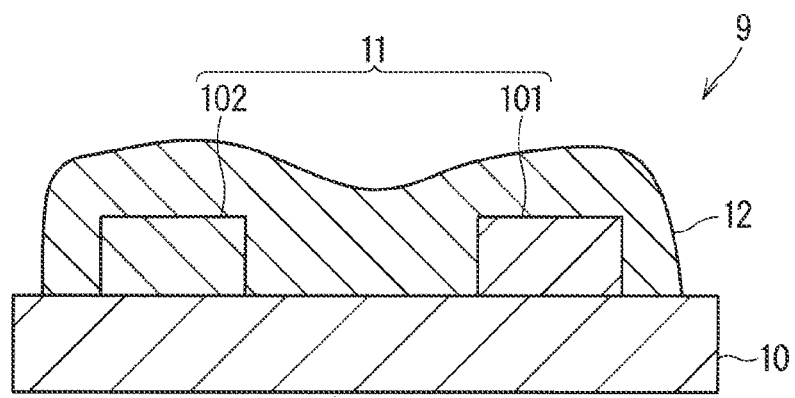
FIGS. 9A and 9B show cross-sectional views schematically illustrating a circuit board of a reference example.
Figure 9B:
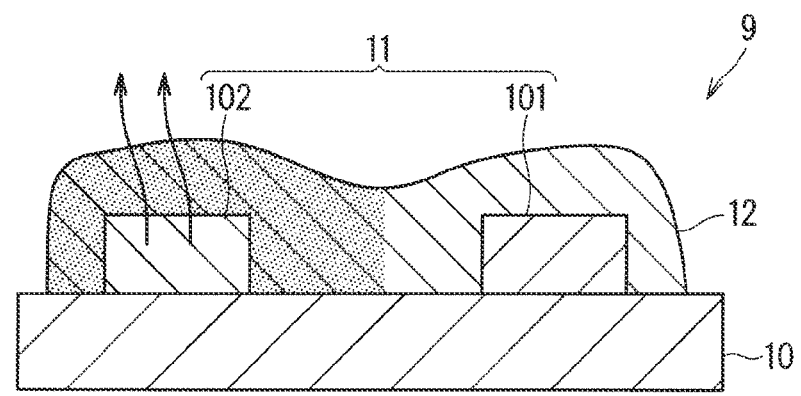

FIGS. 9A and 9B show cross-sectional views schematically illustrating a circuit board of a reference example. FIG. 9A illustrates a state where none of the first electronic component and the second electronic component generates heat. FIG. 9B illustrates a state where the first electronic component does not generate heat and the second electronic component generates heat.

In the circuit board 1 according to Embodiment 1 in FIG. 1, the temperature indicating resin 12 is applied not to the second electronic component 102 but to the first electronic component 101. Thus, the temperature indicating resin 12 comes in contact with not the second electronic component 102 but the first electronic component 101. When the second electronic component 102 generates heat, the temperature indicating resin 12 does not visually change. However, when the first electronic component 101 generates heat, the temperature indicating resin 12 visually changes. Thus, it is possible to visually check whether the first electronic component 101 generates heat, irrespective of whether the second electronic component 102 generates heat.

In contrast, in a circuit board 9 of the reference example in FIGS. 9A and 9B, the temperature indicating resin 12 is applied to both of the first electronic component 101 and the second electronic component 102. Thus, the temperature indicating resin 12 comes in contact with the first electronic component 101 and the second electronic component 102. Thus, when the second electronic component 102 generates heat, the temperature indicating resin 12 visually changes as illustrated in FIG. 9B, irrespective of whether the first electronic component 101 generates heat. Thus, it is impossible to visually check whether the first electronic component 101 generates heat, irrespective of whether the second electronic component 102 generates heat.

3 Embodiment 2

Figure 5A:
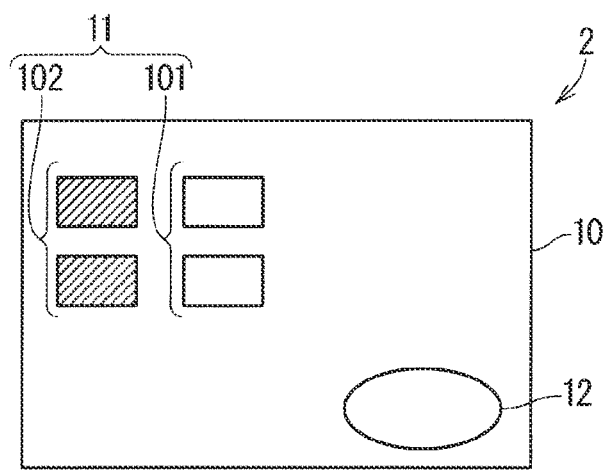
FIGS. 5A and 5B show plan views schematically illustrating a circuit board according to Embodiment 2.
Figure 5B:
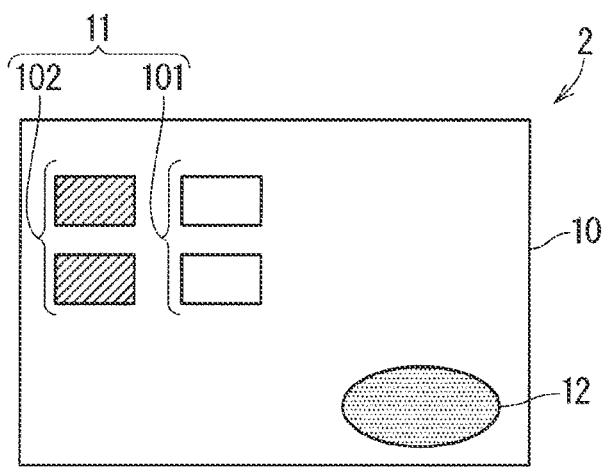

FIGS. 5A and 5B show plan views schematically illustrating a circuit board according to Embodiment 2. FIG. 5A illustrates a state before a thermal stress test is conducted on the circuit board. FIG. 5B illustrates a state after a thermal stress test has been conducted on the circuit board.

A circuit board 2 according to Embodiment 2 in FIGS. 5A and 5B mainly differs in the following points from the circuit board 1 according to Embodiment 1 in FIG. 1. The structures used in the circuit board 1 according to Embodiment 1 are applied to those of the circuit board 2 according to Embodiment 2 which are not described below.

In the circuit board 1 according to Embodiment 1, the temperature indicating resin 12 is applied not to the second electronic component 102 included in the plurality of electronic components 11 but to the first electronic component 101 included in the plurality of electronic components 11. Thus, the temperature indicating resin 12 comes in contact with not the second electronic component 102 but the first electronic component 101.

In contrast, in the circuit board 2 according to Embodiment 2, the temperature indicating resin 12 is applied not to the plurality of electronic components 11 but to the printed circuit board 10. Thus, the temperature indicating resin 12 comes in contact with not the plurality of electronic components 11 but the printed circuit board 10.

Thus, when any of the plurality of electronic components 11 generates heat, the temperature indicating resin 12 does not visually change. However, when the circuit board 1 is exposed to heat, the temperature indicating resin 12 visually changes as illustrated in FIG. 5B. Thus, it is possible to visually check whether the circuit board 1 is exposed to heat, irrespective of whether any of the plurality of electronic components 11 generates heat.

The temperature indicating resin 12 comes in contact with not the plurality of electronic components 11 but the printed circuit board 10. Thus, the temperature indicating resin 12 comes in contact with not a portion of the circuit board 1 whose temperature may increase except when a thermal stress test is conducted on the portion, but a portion of the circuit board 1 whose temperature increases when a thermal stress test is conducted on the portion. When a thermal stress test is conducted on the circuit board 1, the heat applied to the circuit board 1 through the thermal stress test is conducted to the temperature indicating material 111. The temperature of the temperature indicating material 111 becomes higher than room temperatures. Then, the temperature indicating material 111 melts. When the temperature of the temperature indicating material 111 returns to room temperatures and the temperature indicating material 111 hardens, the temperature indicating resin 12 visually changes. Thus, whether a thermal stress test has been conducted on the circuit board 1 can be determined by visually checking whether the circuit board 1 is exposed to heat. This contributes to prevention of skipping a process of conducting a thermal stress test in manufacturing the circuit board 1.

4 Embodiment 3

Figure 6A:
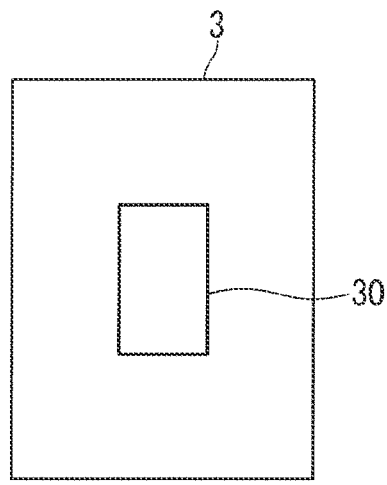
FIGS. 6A and 6B schematically illustrate a semiconductor device according to Embodiment 3.
Figure 6B:
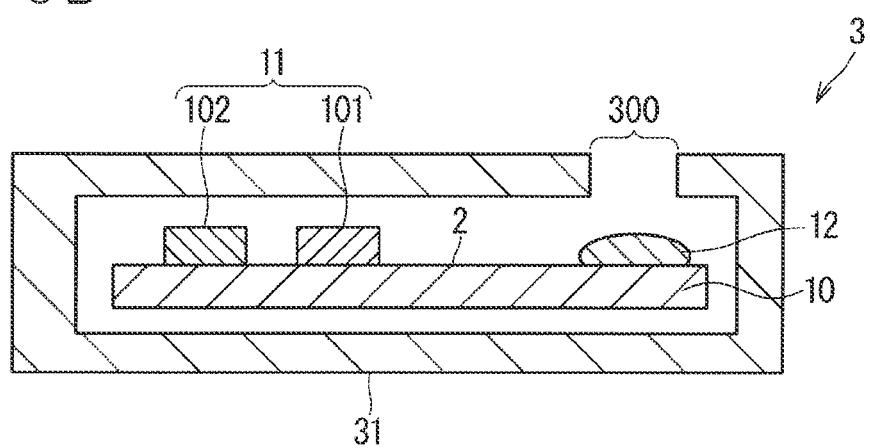

FIGS. 6A and 6B schematically illustrate a semiconductor device according to Embodiment 3.

A semiconductor device 3 according to Embodiment 3 in 6A and 6B is a power semiconductor, for example, a semiconductor module or a semiconductor discrete component including a semiconductor element 30 as illustrated in FIG. 6A. The semiconductor element 30 is, for example, a switching element or a diode.

The semiconductor device 3 includes the circuit board 2 according to Embodiment 2. The semiconductor device 3 may include the circuit board 1 according to Embodiment 1 instead of the circuit board 2 according to Embodiment 2. The circuit board 2 is embedded in the semiconductor device 3.

The semiconductor device 3 includes a sheath 31. The sheath 31 preferably includes an opening 300 facing the temperature indicating resin 12. The opening 300 is an opening for checking a state of the temperature indicating resin 12. Thus, the temperature indicating resin 12 can be visually recognized from the outside of the sheath 31 through the opening 300. This enables checking the state of the temperature indicating resin 12, after the semiconductor device 3 is assembled and the circuit board 2 is embedded in the semiconductor device 3. Furthermore, whether a thermal stress test has been conducted on the circuit board 2 can be determined by visually checking whether the circuit board 2 is exposed to heat. Thus, the state of the temperature indicating resin 12 can be used as an evidence to be presented to a destination of the semiconductor device 3 to show that the thermal stress test has been conducted on the circuit board 2.

The semiconductor element 30 is preferably a semiconductor element including a wide bandgap semiconductor. Examples of the wide bandgap semiconductor include silicon carbide (SiC), gallium nitride (GaN), and diamond (C). The wide bandgap semiconductor such as silicon carbide (SiC), gallium nitride (GaN), or diamond (C) has a bandgap wider than that of a semiconductor such as silicon (Si). Even when used under a high-temperature environment, the semiconductor element including the wide bandgap semiconductor can stably have the electrode-ultrasonic bonding life that is the life of a bonding portion of the electrode by ultrasonic bonding. Furthermore, the space occupied by the semiconductor element can be reduced, which can downsize and reduce weight of the semiconductor device 3.

5 Embodiment 4

In Embodiment 4, the circuit board 1 according to Embodiment 1 or the circuit board 2 according to Embodiment 2, or the semiconductor device 3 according to Embodiment 3 is applied to a power converter. The power converter to which the circuit board 1 according to Embodiment 1 or the circuit board 2 according to Embodiment 2, or the semiconductor device 3 according to Embodiment 3 is applied is not limited to a particular power converter. Embodiment 4 will describe a three-phase inverter to which the circuit board 1 according to Embodiment 1 or the circuit board 2 according to Embodiment 2, or the semiconductor device 3 according to Embodiment 3 is applied.

Figure 7:
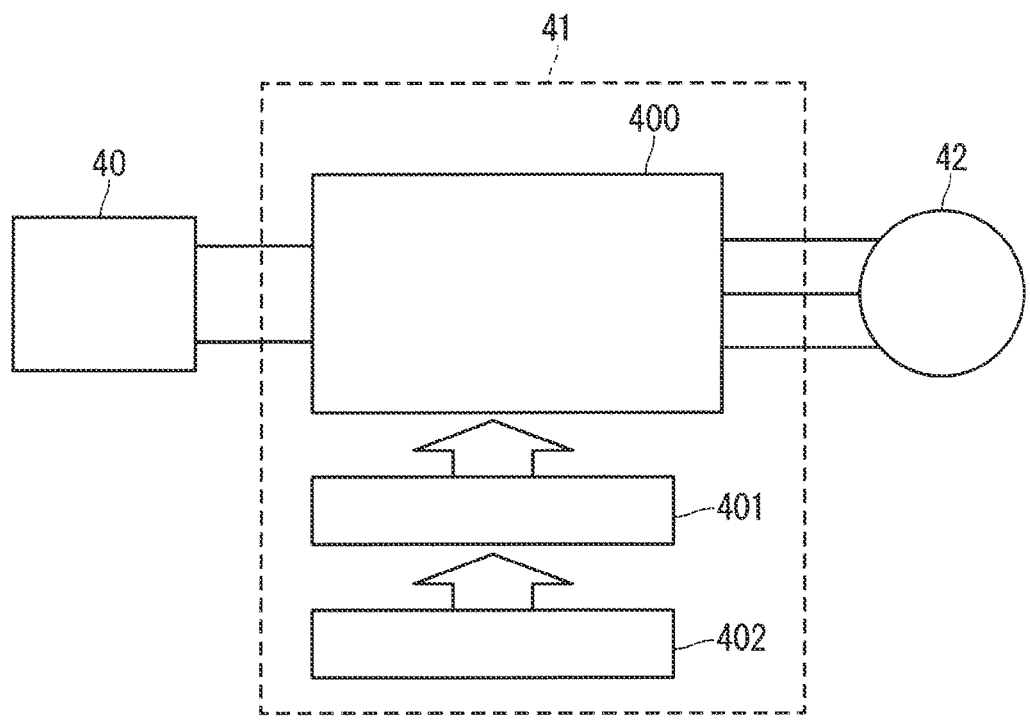
FIG. 7 is a block diagram illustrating a configuration of a power conversion system according to Embodiment 4.

FIG. 7 is a block diagram illustrating a configuration of a power conversion system according to Embodiment 4.

The power conversion system illustrated in FIG. 7 includes a power supply 40, a power converter 41, and a load 42. The power supply 40, which is a DC power supply, supplies a DC power to the power converter 41. The power supply 40 may include various types of components such as a direct current system, a solar battery, or a storage battery, and may include a rectifying circuit connected to an AC system or an AC/DC converter. The power supply 40 may include a DC/DC converter which converts a DC power output from a direct current system into a predetermined power.

The power converter 41, which is a three-phase inverter connected between the power supply 40 and the load 42, converts the DC power supplied from the power supply 40 into the AC power to supply the AC power to the load 42. As illustrated in FIG. 7, the power converter 41 includes a main conversion circuit 400 which converts the DC power into the AC power to output the AC power, a driving circuit 401 which outputs a driving signal for driving each switching element in the main conversion circuit 400, and a control circuit 402 which outputs, to the driving circuit 401, a control signal for controlling the driving circuit 401. At least one of the main conversion circuit 400, the driving circuit 401, and the control circuit 402 may include the circuit board 1 according to Embodiment 1 or the circuit board 2 according to Embodiment 2.

The load 42 is a three-phase electrical motor driven by the AC power supplied from the power converter 41. The load 42 is not limited to specific use but is an electrical motor mounted on various types of electrical devices. Thus, the load 42 is used as an electrical motor for, for example, a hybrid car, an electrical car, a rail vehicle, an elevator, or air-conditioning equipment.

The power converter 41 will be described in detail hereinafter. The main conversion circuit 400 includes switching elements and free-wheeling diodes (not illustrated). Switching of the switching element causes the DC power supplied from the power supply 40 to be converted into the AC power. The AC power is then supplied to the load 42. The specific circuit configuration of the main conversion circuit 400 is of various types. The main conversion circuit 400 according to Embodiment 4 is a three-phase full-bridge circuit having two levels, and can include six switching elements and six free-wheeling diodes anti-parallel connected to the respective switching elements. Each of the switching elements of the main conversion circuit 400 may include the circuit board 1 according to Embodiment 1 or the circuit board 2 according to Embodiment 2. The semiconductor device 3 according to Embodiment 3 may be applied to each of the switching elements of the main conversion circuit 400. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 400 are connected to the load 42.

The driving circuit 401 generates driving signals for driving the switching elements of the main conversion circuit 400, and supplies the driving signals to control electrodes of the switching elements of the main conversion circuit 400. Specifically, the driving circuit 401 outputs, to the control electrodes of the switching elements in accordance with the control signal from the control circuit 402 to be described later, the driving signal for switching the switching element to an ON state and the driving signal for switching the switching element to an OFF state. The driving signal is a voltage signal (ON signal) higher than a threshold voltage of the switching element when the switching element is kept in the ON state. The driving signal is a voltage signal (OFF signal) lower than the threshold voltage of the switching element when the switching element is kept in the OFF state.

The control circuit 402 controls the switching elements of the main conversion circuit 400 so that a desired power is supplied to the load 42. Specifically, the control circuit 402 calculates a time (ON time) at which each of the switching elements of the main conversion circuit 400 should enter the ON state, based on the power to be supplied to the load 42. For example, the control circuit 402 can control the main conversion circuit 400 by performing PWM control for modulating the ON time of the switching elements in accordance with the voltage to be output. Then, the control circuit 402 outputs a control instruction (control signal) to the driving circuit 401 so that the driving circuit 401 outputs the ON signal to the switching element which should enter the ON state and outputs the OFF signal to the switching element which should enter the OFF state at each time. The driving circuit 401 outputs the ON signal or the OFF signal as the driving signal to the control electrode of each of the switching elements, in accordance with this control signal.

Since at least one of the main conversion circuit 400, the driving circuit 401, and the control circuit 402 includes the circuit board 1 according to Embodiment 1 or the circuit board 2 according to Embodiment 2 in the power converter according to Embodiment 4, it is possible to visually check whether the first electronic component 101 generates heat, irrespective of whether the second electronic component 102 generates heat, or to visually check whether the circuit board 2 is exposed to heat, irrespective of whether any of the plurality of electronic components 11 generates heat.

Although Embodiment 4 describes an example of applying the circuit board 1 according to Embodiment 1 or the circuit board 2 according to Embodiment 2, or the semiconductor device 3 according to Embodiment 3 to a three-phase inverter having two levels, the circuit board 1 according to Embodiment 1 or the circuit board 2 according to Embodiment 2, or the semiconductor device 3 according to Embodiment 3 may be applicable not limited to the three-phase inverter but to various power converters. Although Embodiment 4 describes the power converter having two levels, the power converter may have three or multiple levels. The circuit board 1 according to Embodiment 1 or the circuit board 2 according to Embodiment 2, or the semiconductor device 3 according to Embodiment 3 may be applied to a single-phase inverter when the power is supplied to a single-phase load. Moreover, the circuit board 1 according to Embodiment 1 or the circuit board 2 according to Embodiment 2, or the semiconductor device 3 according to Embodiment 3 is also applicable to a DC/DC converter or an AC/DC converter when the power is supplied to, for example, a DC load.

In the power converter to which the circuit board 1 according to Embodiment 1 or the circuit board 2 according to Embodiment 2, or the semiconductor device 3 according to Embodiment 3 is applied, the load is not limited to the electrical motor as described above. The power converter can also be used as a power-supply device of an electrical discharge machine, a laser beam machine, an induction heat cooking device, or a non-contact power feeding system, and can be further used as a power conditioner of, for example, a solar power system or an electricity storage system.

When the downsized and lighter semiconductor device is applied to the power converter 41 according to Embodiment 4, for example, a cooler of the main conversion circuit 400 can be downsized and become lighter. Furthermore, the reliability of the power converter 41 can be enhanced, and the energy consumed by the main conversion circuit 400 can be reduced.

6 Embodiment 5

Figure 8:
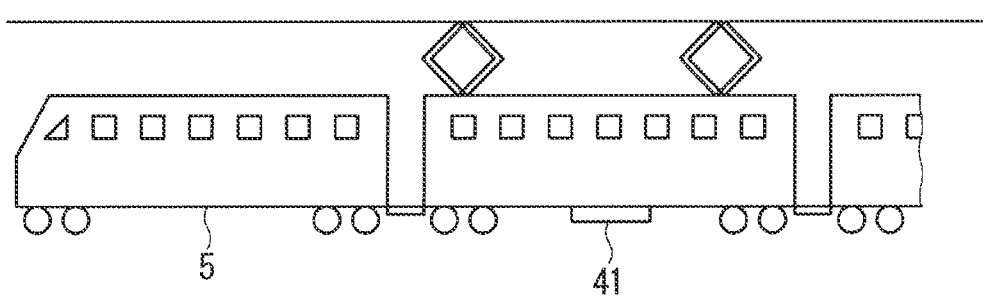
FIG. 8 is a side view schematically illustrating a moving object according to Embodiment 5.

FIG. 8 is a side view schematically illustrating a moving object according to Embodiment 5.

The moving object 5 illustrated in FIG. 8 is a train. The moving object 5 may be other than a train. Examples of the moving object 5 may include a motor vehicle, a ship, a power-assisted bicycle, and an electric wheelchair.

The moving object 5 includes the power converter 41 according to Embodiment 4. The moving object 5 drives, for example, a motor using the power converted by the power converter 41.

Application of the downsized and lighter semiconductor device to the power converter 41 according to Embodiment 4 can downsize and reduce weight of the moving object 5, increase the efficiency of the moving object 5, and increase and the performance of the moving object 5.

Embodiments can be freely combined, and appropriately modified or omitted within the scope of the present invention.

Although the present invention is described in detail, the foregoing description is in all aspects illustrative, and does not limit the invention. Therefore, numerous modifications and variations that have not yet been exemplified are devised without departing from the scope of the present invention.

The invention claimed is:

1. A circuit board, comprising:
a printed circuit board;
a first electronic component mounted on the printed circuit board;
a second electronic component mounted on the printed circuit board; and
a temperature indicating resin that comes in contact with the first electronic component, the temperature indicating resin visually changing upon increase in a temperature, wherein
a temperature indicating resin that comes in contact with the second electronic component does not exist,
the first electronic component is an electronic component that does not generate heat in a normal operation,
the second electronic component is an electronic component that generates heat in a normal operation, and
the temperature indicating resin includes:
a resin;
wax embedded in the resin and
the wax is plate-shaped wax.

2. The circuit board according to claim 1, wherein the first electronic component is a passive component.

3. A circuit board, comprising:
a printed circuit board;
a first electronic component mounted on the printed circuit board;
a second electronic component mounted on the printed circuit board; and
a temperature indicating resin that comes in contact with the first electronic component, the temperature indicating resin visually changing upon increase in a temperature, wherein
a temperature indicating resin that comes in contact with the second electronic component does not exist,
the first electronic component is an electronic component that does not generate heat in a normal operation,
the second electronic component is an electronic component that generates heat in a normal operation,
the temperature indicating resin includes:
a resin;
wax embedded in the resin and
the wax is flake wax.

4. A semiconductor device, comprising:
a circuit board including:
a printed circuit board;
a first electronic component mounted on the printed circuit board;
a second electronic component mounted on the printed circuit board; and
a temperature indicating resin that comes in contact with the first electronic component, the temperature indicating resin visually changing upon increase in a temperature; and
a sheath including an opening facing the temperature indicating resin, wherein
a temperature indicating resin that comes in contact with the second electronic component does not exist,
the first electronic component is an electronic component that does not generate heat in a normal operation,
the second electronic component is an electronic component that generates heat in a normal operation.

5. A semiconductor device, comprising:
the circuit board according to claim 1; and
a semiconductor element including a wide bandgap semiconductor.

6. A power converter, comprising:
a main conversion circuit including a semiconductor device, the main conversion circuit converting an input power to output a resulting power;
a driving circuit outputting, to the semiconductor device, a driving signal for driving the semiconductor device; and
a control circuit outputting, to the driving circuit, a control signal for controlling the driving circuit,
wherein at least one of the main conversion circuit, the driving circuit, and the control circuit includes the circuit board according to claim 1.

7. A moving object comprising the power converter according to claim 6.

* * * * *